United States Patent [19]
Seidler et al.

[11] Patent Number: 5,622,874
[45] Date of Patent: Apr. 22, 1997

[54] PROCESS FOR FORMING A MAGNETORESISTIVE SENSOR FOR A READ/WRITE HEAD

[75] Inventors: Gerald T. Seidler, Plainsboro; Stuart A. Solin, Princeton Junction, both of N.J.

[73] Assignee: NEC Research Institute, Inc., Princeton, N.J.

[21] Appl. No.: 668,415

[22] Filed: Jun. 21, 1996

Related U.S. Application Data

[63] Continuation-in-part of Ser. No. 572,833, Dec. 14, 1995.
[51] Int. Cl.$^6$ ................................................... H01L 43/00
[52] U.S. Cl. ......................................... 438/3; 438/385
[58] Field of Search ........................... 437/7, 418, 60, 437/226; 48/DIG. 136, DIG. 145; 360/113; 338/32 R; 257/425

[56] References Cited

U.S. PATENT DOCUMENTS

| | | | |
|---|---|---|---|
| 3,617,975 | 11/1971 | Wieder | 360/113 |
| 5,014,147 | 5/1991 | Parkin et al. | 360/113 |
| 5,065,130 | 11/1991 | Eck et al. | 338/32 R |
| 5,117,543 | 6/1992 | Heremans et al. | 148/DIG. 65 |
| 5,184,106 | 2/1993 | Partin et al. | 338/32 R |
| 5,438,470 | 8/1995 | Ravipati et al. | 360/113 |
| 5,491,600 | 2/1996 | Chen et al. | 367/113 |
| 5,496,759 | 3/1996 | Yue et al. | 437/52 |
| 5,536,953 | 7/1996 | Dreifus et al. | 257/77 |
| 5,576,914 | 11/1996 | Rottmayer et al. | 360/113 |

*Primary Examiner*—John Niebling
*Assistant Examiner*—S. Mulpuri
*Attorney, Agent, or Firm*—Jeffery J. Brosemer

[57] ABSTRACT

A sensor for use in read/writing the magnetic pattern stored in a magnetic storage disk uses a Corbino structure comprising inner and outer electrodes enclosing a magnetoresistive element. The sensor is formed at the front surface of a stack of superposed layers of which the first and fifth are of a high resistivity semiconductive material, the second and fourth are of a magnetoresistive material and the third of a metal or composite structure. The second and fourth layers form a loop around the third layer, the first and fifth form a loop around the second and fourth layers. A dopant is diffused into the front surface of the stack to convert edge portions of the first and fifth layers to low resistivity to form a conductive loop that serves as the outer electrode of the Corbino disk, the third electrode serving as the inner electrode.

10 Claims, 2 Drawing Sheets

PROCESS FOR FORMING A MAGNETORESISTIVE SENSOR FOR A READ/WRITE HEAD

RELATED APPLICATIONS

This is a continuation in part of United States patent application Ser. No. 08/572,833 filed on Dec. 14, 1995, now pending.

FIELD OF THE INVENTION

This relates to a new process for fabricating semiconductive devices that have small dimensions.

The invention is of particular interest to the fabrication of a sensor that uses a Corbino disk-like structure as the active magnetoresistive element for read/writing a magnetic pattern stored on a magnetic disk, as is described in copending applications Ser. No. 08/396,819 filed Mar. 2, 1995 and Ser. No. 08/435,254 filed May 5, 1995, each assigned to the same assignee as the instant application.

BACKGROUND OF THE INVENTION

As is known, a Corbino structure comprises a magnetoresistive element, an inner electrode surrounded by the magnetoresistive element and an outer electrode surrounding the magnetoresistive element. When a voltage is applied across the inner and outer electrodes to establish a radial electric field in the magnetoresistive element and the element is used to read a pattern stored on a magnetic storage medium, the current flowing between the electrodes will be modulated by magnetic flux passing perpendicularly through the radial electric field. Such modulation can be detected and amplified to provide a replica of the signal information stored on the magnetic storage medium. Because of the small dimensions involved in such a sensor, it is difficult to make it reliably and simply.

The main object of the present invention is a process for making such a device reliably and simply, but it will be appreciated that the principles involved in the processing may have wider application to the processing of other semiconductive devices.

SUMMARY OF THE INVENTION

A feature of the invention is that it is formed by the deposition of a succession of layers of varying characteristics superimposed on one another to form a stack in which edges of various layers of the stack form a planar surface that includes a structure of the kind desired, specifically, a Corbino structure. One characteristic of the process is that most dimensions of the structure are determined by the thicknesses and widths of the deposited layers, and one important dimension is controlled by the depth of a dopant diffusion into a planar edge of the stack. These factors make control of the dimensions relatively easy. Moreover, by appropriate choice of the geometry of the layers, layers of the same material that were not deposited in succession may be made to link with one another in a fashion to enclose layers of different materials that were deposited between the layers of the same material.

Moreover, by diffusing into an edge of the stack a dopant that affects the conductivity only of selected ones of the deposited layers of the stack, there can be formed at such edge of the stack a closed conductive path that can serve as the outer electrode of the Corbino structure, surrounding an inner electrode.

An illustrative embodiment of the process aspect of the invention would be as follows. On a suitable conducting substrate, there is deposited a first layer of a semiconductive material that is of high resistivity but that can be made to have high conductivity by the introduction of a suitable diffusant. Over this layer there is deposited a second layer of a material that is highly magnetoresistive. This second layer is made narrower than the first layer. Next, there is deposited over the second layer a third layer of a conductive material that can serve as the inner electrode of the Corbino structure. This third layer is narrower still than the second layer. Over the third layer is deposited a fourth layer that is of the same magnetoresistive material as the second layer and that forms a bridge over the third layer. Next, there is deposited a fifth layer that is of the same semiconductive material as the first layer and that forms a bridge over the fourth layer. At this stage, at the front edge of the stack formed by the various layers, there is formed a structure that includes an outer loop of the first semiconductive material enclosing an inner loop of the second magnetoresistive material enclosing a layer of the third conductive material. At this point, it is advantageous to coat the workpiece with an insulator, such as silicon oxide, that is easy to deposit and that can serve as a diffusion mask. Next, the front edge of the stack advantageously is then cleaved and/or polished to form a smooth planar edge, relatively free of edge effects. Then, a diffusant that is able to reduce selectively the resistivity of the semiconductive material of the first and fifth layers is introduced at this edge to do so, whereby at the front edge there is formed a highly conductive closed loop that can serve as the outer electrode of the Corbino structure, while the third layer can serve as the inner electrode. Terminal connections are then provided to the first and third layers.

Typically, the first and fifth layers can be of a semiconductor, such as silicon or gallium arsenide, and the second and fourth layers of a magnetoresistive material, such as mercury cadmium telluride or mercury zinc telluride. The third layer can be of a metal, such as a molydenium-gold alloy, that makes a good connection to the material of the second and fourth layers. Moreover, the second and fourth layers advantageously are of crystalline material to maximize the magnetoresistive effect. To this end, the first layer should be substantially monocrystalline to further substantially-epitaxial crystalline growth of the second and fourth layers, although polycrystalline materials may be satisfactory as well.

Because the magnetoresistive characteristic of a Corbino structure is symmetric with respect to the polarity of the magnetic field being sensed, if the disk is to be sensitive to polarity, it is important to include a biasing field on the disk to make the characteristic asymmetric. The desired biasing field can be provided by coating the workpiece appropriately with a layer of a hard-magnetic material. It may also be desirable in some instances to use a common head both for reading and writing. To this end, the writing functions may be added by including an electromagnet within the workpiece that can be energized to write information onto a storage disk. The electromagnet can take the form of a thin layer patterned to serve as a single loop coil that is included in the stack of layers adventageously enclosed within the inner electrode of the disk to maintain symmetry.

The invention will be better understood from the following more detailed description taken in conjunction with the accompanying drawing.

DETAILED DESCRIPTION OF THE INVENTION

Figure 1:
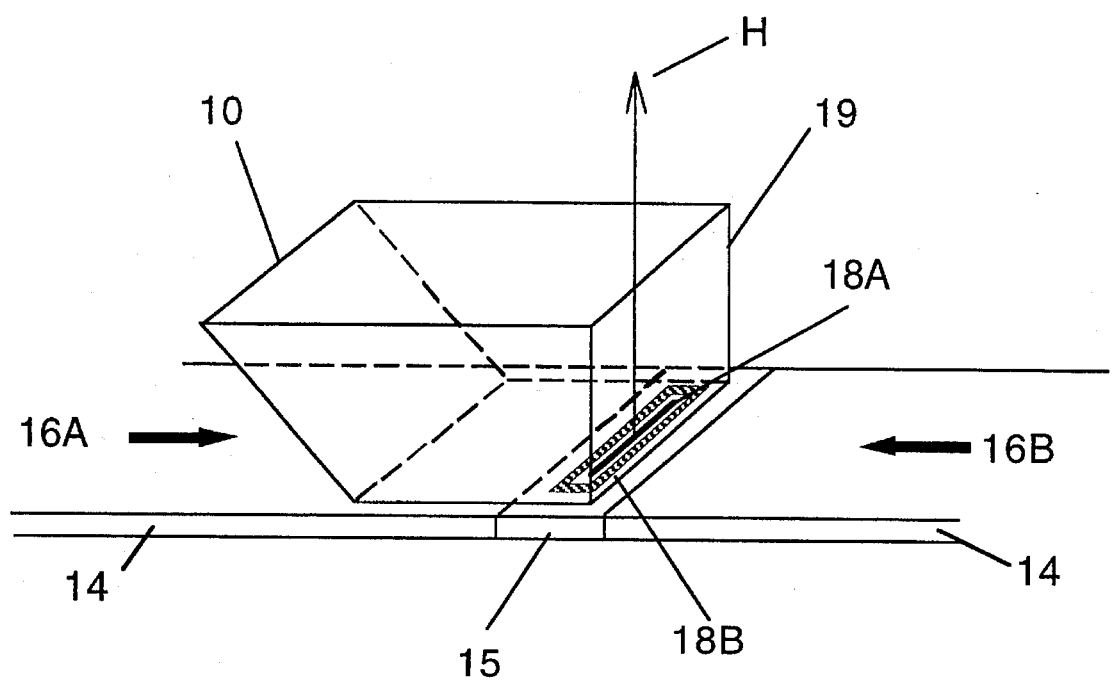
FIG. 1 shows a reading head including a magnetoresistive sensor of the kind that is described in the aforementioned earlier-filed applications.

With reference now to FIG. 1, the reading head 10, including the active element (comprising 18A and 18B) that serves as the magnetic sensor, is shown positioned over a portion of the magnetic medium 14 of a disk on whose tracks is stored the information to be read. The information is read by sensing the external vertical magnetic field H created above the transition region 15 between directional changes of the aligned magnetic moments 16A, 16B that extend along the track of the magnetic medium 14.

The active element is formed by a Corbino structure that includes a layer of a material that exhibits a strong magnetoresistive effect. The active element further includes a first inner electrode 18A that is surrounded by the magnetoresistive material and a second outer electrode 18B that surrounds the inner electrode, in the manner characteristic of a Corbino. Typically, the outer electrode 18B, which is shown rectangular in shape, has a long dimension of about 5 microns to match approximately the width of a track of the magnetic medium and a narrow dimension of about 500 to 1,000 Angstroms. Typical dimensions of the inner electrode 18A are a length of about 1 micron and a width of about 200 to 400 Angstroms.

Figure 2:
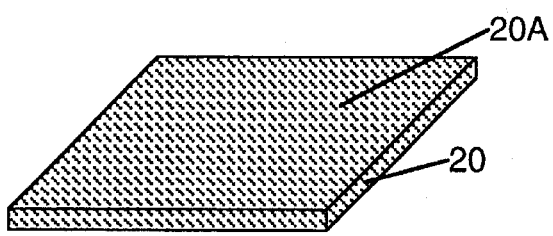
FIGS. 2A–2G illustrate, in perspective, a workpiece being processed, in various stages of its preparation as a magnetoresistive sensor in accordance with an illustrative embodiment of the invention.
Figure 2:
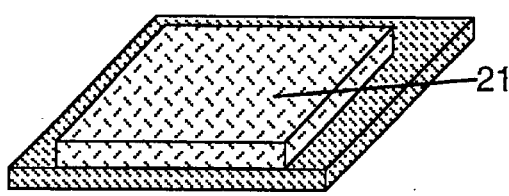
Figure 2:
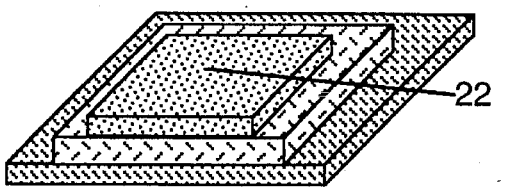
Figure 2:
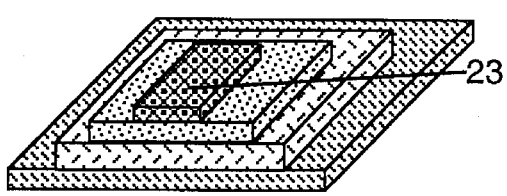
Figure 2:
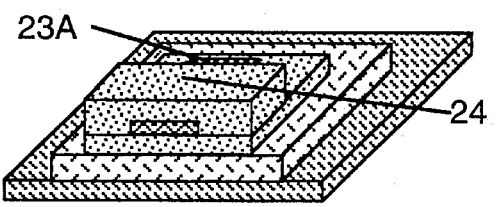
Figure 2:
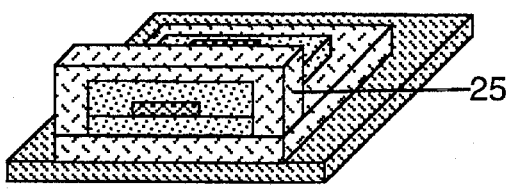
Figure 2:
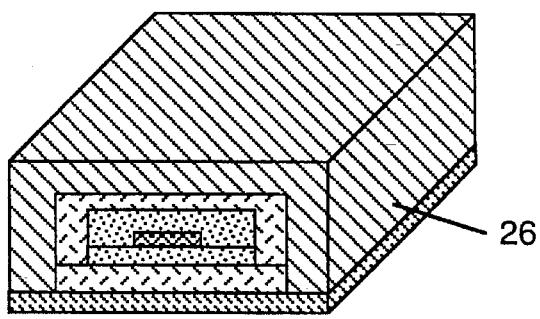

In accordance with one embodiment of the present invention, the active element positioned on the reading head is prepared as follows. There is first prepared a suitable substrate 20, as shown in FIG. 2A, advantageously of a semiconductor such as silicon or gallium arsenide, that may be substantially monocrystalline so that there can be grown thereover epitaxial layers that are substantially crystalline. Those skilled in the art can readily recognize that the substrate may be polycrystalline as well, as long as there can be grown thereover the subsequent epitaxial layers. At least the top surface 20A of the substrate 20 should be doped to be sufficiently conductive to serve well as one terminal of the sensor. There is then deposited over the substrate surface 20A, a first layer 21, which advantageously is of the same semiconductive material, as the substrate 20 though essentially undoped. Advantageously, this layer 21 is deposited to be essentially monocrystalline. As seen in FIG. 2B, this layer 21 is patterned to be narrower and shorter than the substrate 20. The patterning advantageously is done by photolithographic and etching techniques of the kind well-known in the microelectronics industry.

Next, as seen in FIG. 2C, there is deposited a second layer 22 of a material that has good magnetoresistive properties, such as zero-gap mercury cadmium telluride or mercury zinc telluride. Advantageously, this layer is grown also to be highly crystalline to increase the magnetoresistive effect. This layer is patterned to be narrower and shorter than the first layer 21.

Next, as shown in FIG. 2D, a third layer 23 of a conductive material, such as a molydenum-gold alloy that will make a good ohmic connection to the second layer, is deposited and patterned to be narrower than the second layer 22.

Next, as shown in FIG. 2E, a fourth layer 24, advantageously of the same magnetoresistive material as the second layer 22 is deposited to bridge the metallic layer 23 and form a continuous loop of magnetoresistive material around the metallic layer 23. This fourth layer is patterned, as shown, so that the metallic layer is centered within the loop but there is left exposed an end portion 23A of the metallic layer 23 to which a terminal connection may subsequently be made.

Next, as shown in FIG. 2F, there is deposited a fifth layer 25, advantageously of the same material as the first layer 21, and it is patterned to form a bridge over the fourth layer 24 and a continuous loop that surrounds the fourth layer 24. Advantageously there is left uncovered the portion 23A of the metallic layer 23 until a terminal connection has been made to it.

The basic elements of the magnetoresistive sensor for reading are now essentially in place. There remains the need to diffuse an impurity into the exposed front face of the stack to dope the exposed front edge of the loop of undoped semiconductor formed of the first and fifth layers (21, 25) to a conductive state so that the doped loop can serve as the conductive outer electrode of the Corbino structure.

However, since it is likely that the edge is not especially uniform, it usually will be advantageous to eliminate the original edge material and form a new edge by cleaving.

To this end, there is deposited over the workpiece a protective coating 26 of a passive material, such as an oxide or cadmium sulfide, and then the front edge of the workpiece is cleaved to leave a clean uniform surface, as seen in FIG. 2G.

After this cleaving, the stack is heated in an appropriate atmosphere for the diffusion of a suitable dopant, such as phosphorus if the semiconductive material of the first and fifth layers is silicon (tellurium if the layers are of gallium arsenide), to convert the exposed front edges of these layers to a higher conductivity appropriate to their role as the outer electrode of the Corbino structure. The dopant chosen for the diffusant should be one that little affects the magnetoresistive properties of the material of the second and fourth layers. The passive coating 26 serves to mask all but the cleaved front surface from the diffusant during the diffusion step. By control of the parameters of the diffusion, there can be controlled the depth that the dopant penetrates into the edge of the stack. As mentioned earlier, the various materials of the stack are such that the diffusant affects the conductivity, selectively only of the first and fifth layers. This depth effectively controls how much of the magnetoresistive material will serve actively. For high sensitivity during sensing, it is advantageous that only the edge region that is proximate to the storage medium and which experiences large changes in the fringing magnetic field at regions of polarization reversals be active. The optimum depth typically will be a function of the characteristics of the storage disk being read and how close to the disk the sensor will be kept during operation and is best determined experimentally for a given design.

Moreover, because of the relatively fragile nature of the cleaved edge surface, it may be advantageous to coat it with a suitable passivation layer, such as a thin layer of zinc sulfide or cadmium telluride before use for sensing.

As was mentioned earlier, if the sensor is to discriminate on the basis of the polarity of the magnetic field, it is important to add a bias field to provide the desired asymmetry between the two possible polarities. To this end, there would be deposited over a surface of the stack a layer of a hard magnetic material that can serve as a permanent magnet providing the desired bias field in the Corbino structure.

Figure 3:
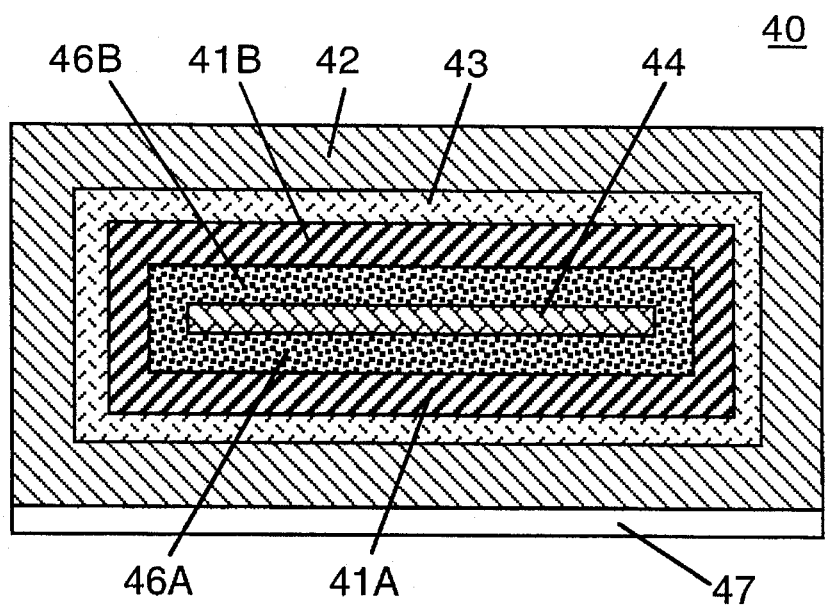
FIG. 3 is a front view of the active edge of an embodiment that includes both a magnet for biasing and a single-loop writing coil.

Additionally, if the head is to be used also for writing, this can be provided by including a writing coil in the stack of layers. To maintain symmetry in the Corbino structure, it is advantageous to include the writing coil within the inner electrode as illustrated in FIG. 3. As shown, FIG. 3 is an end view of the surface that is to be proximate the track of the storage disk to be read or written. The head 40 comprises an inner electrode including top and bottom sections 41A, 41B and an outer electrode 42 between which is included the magnetoresistive element 43. The single-loop writing coil 44 is included within the two sections of the inner electrode and insulated electrically therefrom by the insulating region including a bottom section 46A and a top section 46B.

A variety of techniques can be used to achieve the desired structure.

For example, the process previously described can be modified to enclose the single loop coil within the inner electrode by first forming a patterned layer of metal corresponding to the bottom section 41A of the inner electrode. Over this there is deposited a patterned layer of insulating material to form the bottom section 46A of insulating material. Next, there is deposited a strip 44 of the same semiconductive material that is being used to form the outer electrode 42 and within which a dopant will be diffused to make it conductive at the same time as the outer electrode is being made conductive. Then there is deposited a pair of conductive strips (not seen) that complete the single loop and serve as the terminals to which signals to be stored are supplied. Next, there is deposited the top section 46B of the insulating material. Then, there is deposited the top section 41B of the inner electrode.

The process can then proceed in the manner earlier described for providing the top section of the magnetoresistive loop and the top section of the semiconductive loop. This can then be followed by the masking step and the cleaving step, after which one can proceed with the diffusion step that dopes to a conductive state both the edge of the outer semiconductive loop for serving as the outer electrode and the edge of the strip 44 for serving as a portion of the single loop coil of the electromagnet used for writing. Thereafter, there is deposited the layer 47 of magnetic material on one surface to serve as the permanent magnet that provides the biasing field.

It is to be understood that the specific embodiment described is merely illustrative of the general principles of the invention and that other embodiments might be devised by a worker in the art without departing from the spirit and scope of the invention. In particular, various other choices of materials should be feasible.

What is claimed is:

1. A process for preparing a sensor suitable for read/writing a magnetic pattern stored in tracks in a storage medium comprising:

forming on a conductive surface of a substrate a first layer of semiconductive material that is of high resistivity;

forming on a limited portion of said first layer a second layer of a material that exhibits a magnetoresistive effect suitable for use by the sensor;

forming on a limited portion of said second layer a third layer of high conductivity;

forming over said third layer a fourth layer that is of the same material as said second layer and then that joins with the second layer to form a loop enclosing a front end portion of the third layer;

forming a fifth layer that is of the same material as the first layer and that joins with the first layer to form a loop enclosing a front end portion of the second, third and then fourth layers; and diffusing into the front edge portions of the first and fifth layers a dopant of a type to increase the conductivity of the diffused regions of the first and fifth layers with essentially little effect on the resistivity of the second and fourth layers for forming a conductive loop around the second and fourth layers for use as the outer electrode of a Corbino-disk, the third layer forming the inner electrode of said disk.

2. The process of claim 1, in which the first, second, third, fourth and fifth layers form a stack such that the front edge portions of the layers lie essentially on a common plane.

3. The process of claim 2, in which the stack of the first, second, third, fourth and fifth layers is cleaved to provide a cleaved front surface thereto before the diffusing step and the diffusing is done into the cleaved front surface.

4. The process of claim 3, in which material of the second and fourth layers is a magnetoresistive material chosen from the group consisting of mercury cadmium telluride and mercury zinc telluride.

5. The process of claim 3, in which the material of the second and fourth layers is chosen from the group consisting of silicon and gallium arsenide.

6. The process of claim 5, in which the material of the second and fourth layers is magnetoresistive material chosen from the group consisting of mercury cadmium telluride or mercury zinc telluride.

7. The process of claim 6, in which the third layer is of a gold-molybdenium alloy.

8. The process of claim 1 that further includes the step of including on the stack formed by the five layers a layer of permanent magnet material for providing a bias field in the magnetoresistive material forming the second and fourth layers.

9. The process of claim 1 that further includes the step of including in the stack formed by the five layers a single loop coil for providing an electromagnetic field for writing a magnetic pattern for storage in the storage medium.

10. The process of claim 9 in which the single loop coil is enclosed within the inner electrode but insulated therefrom, the inner electrode being formed as a closed loop surrounding the single loop coil.

* * * * *